United States Patent

Confalonieri

[11] Patent Number: 6,100,747
[45] Date of Patent: Aug. 8, 2000

[54] DEVICE FOR SELECTING DESIGN OPTIONS IN AN INTEGRATED CIRCUIT

[75] Inventor: Pierangelo Confalonieri, Bergamo, Italy

[73] Assignee: STMicroelectronics, S.r.l., Agrate Brianza, Italy

[21] Appl. No.: 09/250,843

[22] Filed: Feb. 16, 1999

Related U.S. Application Data

[63] Continuation of application No. 08/778,416, Dec. 31, 1996, abandoned, which is a continuation-in-part of application No. 08/453,402, May 30, 1995, abandoned.

[51] Int. Cl.[7] .................................................. H01H 37/76
[52] U.S. Cl. .......................................... 327/525; 327/564
[58] Field of Search .......................... 327/525, 564–566, 327/583, 493, 309, 325, 365, 387, 378, 388, 392, 393; 257/532, 300, 595

[56] References Cited

U.S. PATENT DOCUMENTS

| | | | |
|---|---|---|---|
| 4,287,441 | 9/1981 | Smith | 307/353 |
| 4,413,237 | 11/1983 | Baba | 331/108 C |
| 4,533,841 | 8/1985 | Konishi | 307/468 |
| 4,580,063 | 4/1986 | Torelli et al. | 307/200 B |
| 4,614,881 | 9/1986 | Yoshida et al. | 307/219 |
| 4,730,129 | 3/1988 | Kunitoki et al. | 307/362 |
| 4,903,111 | 2/1990 | Takemae et al. | 357/51 |
| 5,018,000 | 5/1991 | Yamada et al. | 357/51 |
| 5,177,375 | 1/1993 | Ogawa et al. | 307/272.3 |
| 5,360,989 | 11/1994 | Endo | 257/532 |
| 5,386,152 | 1/1995 | Naraki | 327/143 |
| 5,410,186 | 4/1995 | Bonaccio et al. | 307/29 |

FOREIGN PATENT DOCUMENTS

| | | |
|---|---|---|
| 0 045 895 | 2/1982 | European Pat. Off. . |
| 3078315 | 4/1991 | Japan . |
| 3-265213 | 11/1991 | Japan . |
| 2206 730A | 1/1989 | United Kingdom . |

OTHER PUBLICATIONS

"Precision 'Power–on–Reset' Control Circuit," *IBM Technical Disclosure Bulletin*, vol. 32, No. 7, Dec. 1989, pp. 159–160.

*Primary Examiner*—Terry D. Cunningham
*Assistant Examiner*—Quan Tra
*Attorney, Agent, or Firm*—Theodore E. Galanthay; David V. Carlson; Seed IP Law Group PLLC

[57] ABSTRACT

The device permits selection between two design options of an integrated circuit by causing a corresponding circuit unit of the integrated circuit to adopt one of two possible different operative states. More specifically, the device provides an inverter, of which the output terminal is connected to the control terminal of the circuit unit and the input terminal is connected to first and second supply terminals, via a conductor and a capacitor, respectively. The conductor can be broken by means outside the integrated circuit, and the capacitor is connected in parallel with a diode connected for reverse conduction. The device does not require control signals, takes up a very small area, has practically zero consumption, and can be formed in unlimited numbers on the same integrated circuit.

11 Claims, 2 Drawing Sheets

DEVICE FOR SELECTING DESIGN OPTIONS IN AN INTEGRATED CIRCUIT

CROSS-REFERENCE TO RELATED APPLICATION

This application is a continuation of U.S. patent application Ser. No. 08/778,416 filed Dec. 31, 1996, now abandoned, which is a continuation-in-part of application Ser. No. 08/453,402, filed May 30, 1995, now abandoned. Applicant incorporates application Ser. Nos. 08/788,416 and 08/453,402 herein by reference.

TECHNICAL FIELD

The present invention relates to the design of integrated semiconductor circuits and, more particularly, to a device for selecting design options in an integrated circuit.

BACKGROUND OF THE INVENTION

It is known that, during the design of a complex integrated circuit, it is often difficult to establish with certainty beforehand the most advantageous circuit configuration or the most suitable component to achieve a predetermined functional effect. For example, it may be difficult, if not impossible, to evaluate the best time constant for a certain function, or the most appropriate intervention threshold for a given circuit, or the ideal current which a current-generator should supply. Moreover, it may also be useful to test a section of the integrated circuit in several different operative conditions, for example, with and without a network for correcting a parameter, in order to evaluate the effect of the correction, as in the case of an "offset"-canceling circuit, the exclusion of which would allow the magnitude of the "offset" to be evaluated.

It is also known that, during the design of an integrated circuit, it may be convenient to leave the selection between several variants of the circuit configurations and/or parameters open, to permit the production of integrated circuits the general functional characteristics of which are substantially identical, but which satisfy slightly different applicational requirements.

Thus, to allow for the "design options" described above, it is often necessary, at the design stage, to provide for modifiable connections or for selectively addressable memory cells or registers which enable the inputs of associated circuit units to be modified so as to adopt different operative states in dependence on the states of the aforesaid modifiable connections or of the memory cells or registers.

The various options are then tested and, of these, the one which offers the functional characteristics closest to those desired is selected and the final topography of the integrated circuit to be put into production is consequently defined.

The known techniques for satisfying the design requirements described above provide for the use of terminals of the device by means of which connection may or may not be established, of fuses within the integrated circuit which can be broken by means of high currents applied between suitable terminals of the integrated circuit, of EPROM cells, of programmable register cells, or of different metallization masks for the various design options. All of these techniques, except for the last mentioned, take up quite large areas of the integrated circuit; in particular, the use of terminals of the device requires the formation of contact pads which, as is known, necessarily have large dimensions; fuses require wide metal connecting strips because of the high currents necessary to break them and are also unreliable; in addition to the space which they take up, EPROM cells also require a special manufacturing process. In any case, for all these techniques, it is necessary to provide piloting signals which, in order to control the integrated circuit, naturally have to be conducted to the corresponding points by means of suitable metal tracks which are also very bulky.

As is known to a designer of integrated circuits, after the most favorable design options have been defined, modification of the topography of the integrated circuit in order to recover the areas intended for the test components and/or connections often cannot be accomplished, and these areas are therefore inevitably lost, detracting from the compactness of the final integrated structure.

As regards the technique which provides for different metallization masks for the various options, that is, variations in the mask for the formation of the last layer of connections in the sequence of steps of the manufacturing process, the problem is not the area taken up since, in this case, additional components or connections are not necessary, but, rather, the cost and the time necessary to put it into practice. In fact, each variant to be tested corresponds to a different mask, which itself is quite expensive, and to the manufacture of a batch of test chips, which requires a very long waiting time to evaluate the test. This technique is therefore suitable only when the number of variants to be tested is very low.

SUMMARY OF THE INVENTION

An object of the present invention is to propose a device for selecting between design options in an integrated circuit which is reliable, which has practically zero power consumption, which takes up a very small area, which does not require additional masks or process steps, and which is usable without limitations on the number of variants to be tested.

According to one aspect of the present invention, a circuit is provided for selecting one of a number of design configurations for an integrated device. The circuit includes first and second supply terminals, and a circuit unit that configures itself in one of the configurations in response to a signal. A removable link has a first link terminal coupled to the first supply terminal and a second link terminal. A buffer has a buffer input terminal coupled to the second link terminal and a buffer output terminal coupled to the circuit unit. The buffer generates the signal at its output terminal. A diode has a cathode coupled to the buffer input terminal and an anode coupled to the second supply terminal.

BRIEF DESCRIPTION OF THE DRAWINGS

The invention will be better understood from the following description, which is given by way of nonlimiting example, with reference to the appended drawings, in which.

DETAILED DESCRIPTION OF THE INVENTION

Figure 1:
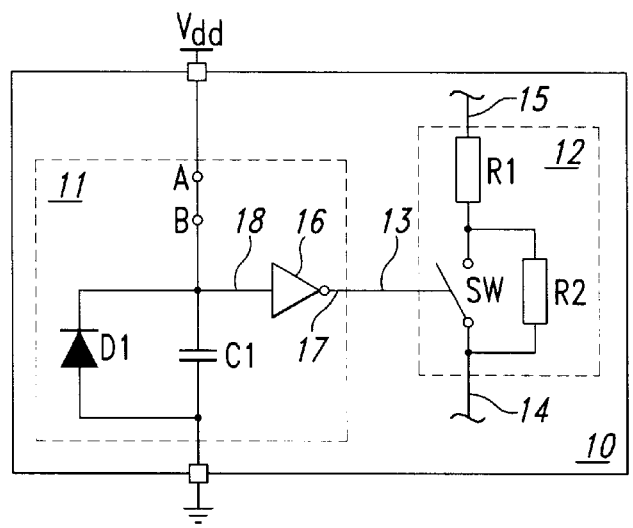
FIG. 1 is a schematic circuit diagram showing an integrated circuit comprising a device according to the invention.

In FIG. 1, an integrated circuit 10 comprises a device 11 according to the invention, and a circuit unit 12. Unit 12 represents, by way of example, a very simple form of a circuit which can adopt two different operative states in dependence on a signal applied to a control terminal thereof. Unit 12 comprises two resistors R1 and R2 connected in series, and an electronic switch shown as a switch SW, which is connected in parallel with R2 and has a control terminal 13. Clearly, in this case, the two different operative states are two different values of the resistance between the terminals 14 and 15 of the circuit unit 12, depending upon the open or closed state of the electronic switch SW.

The selection device 11 comprises an inverter 16, of which the output 17 is connected to the control terminal 13 of the electronic switch SW, and the input terminal 18 is connected to one of the supply terminals of the integrated circuit, indicated Vdd, by means of a conductor which is breakable between two points A and B. The input 18 of the inverter 16 is also connected to the other supply terminal of the integrated circuit, indicated by the ground symbol, by capacitive means which, in this embodiment, is a capacitor C1 connected in parallel with a component with unidirectional conduction which, in this embodiment, is a diode D1 connected for reverse conduction as shown.

The connection between the input 18 and the supply terminal Vdd, or at least the portion thereof between the points A and B, comprises a conductive track or link, preferably of metal, which extends on the integrated circuit or, more precisely, on the surface of the "chip" of semiconductor material, on which it is formed, and can easily be recognized by the usual instruments for inspecting the surfaces of semiconductor devices and can be broken, removed, or opened by means of a normal mechanical or laser cutting instrument.

With the connection between A and B intact, the input of the inverter 16 is at a high level and its output 17 is therefore at a low level. Under these conditions, the electronic switch SW is not activated, that is, it is open and the state of the unit 12 between its terminals 14 and 15 is defined by the sum of the resistances of the two resistors R1 and R2 in series.

If the connection between the points A and B is broken, the potential at the input terminal 18 is substantially that of ground, i.e., zero volts, and the output of the inverter 15 is therefore at a high level. Under these conditions, the electronic switch SW is activated, that is, it is closed, and the state of the unit 12 between its terminals 14 and 16 is defined by the resistance of the resistor R1 alone, since the resistor R2 is short-circuited by the switch SW. The function of the diode D1 is to prevent the input terminal 18, the resistance of which with respect to ground is practically infinite, from being charged to a positive potential; this potential could reach the threshold at which the inverter is triggered as a result of any charges trapped in the dielectric of the capacitor C1 and in the input capacitance of the inverter 16 after long periods of operation of the integrated circuit. The diode D1 introduces a finite, although very high, resistance between the input terminal 18 and ground. That is, diode D1 allows a leakage current to flow between terminal 18 and ground when charge accumulates at node 18. This leakage current discharges node 18, and thus prevents the accumulation of charge at node 18 when the connection between points A and B is opened or otherwise removed. On the other hand, diode D1 does not affect the operation of the device when the connection between the points A and B is intact, since it is connected for reverse conduction.

Figure 2:
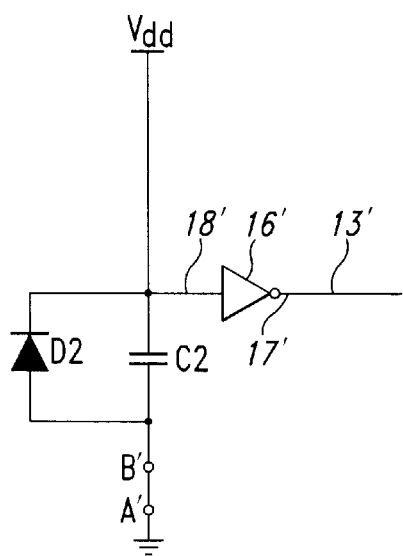
FIG. 2 is a schematic circuit diagram showing a variant of the device according to the invention.

FIG. 2 shows the inverse version of the device 11 of FIG. 1. In this case, in fact, the output terminal 17' of the inverter 16' is at a high level if the connection between its input 18' and ground is intact and is at a low level if the connection is broken. The capacitor C2 and the diode D2 have the same functions as the capacitor C1 and the diode D2 of FIG. 1; they serve, respectively, to ensure that, after the connection between A' and B' has been cut, the input terminal 18' of the inverter 16' remains at a high value, that is, close to the positive supply voltage Vdd, and to constitute a finite resistance between that terminal and the terminal Vdd.

Figure 3:
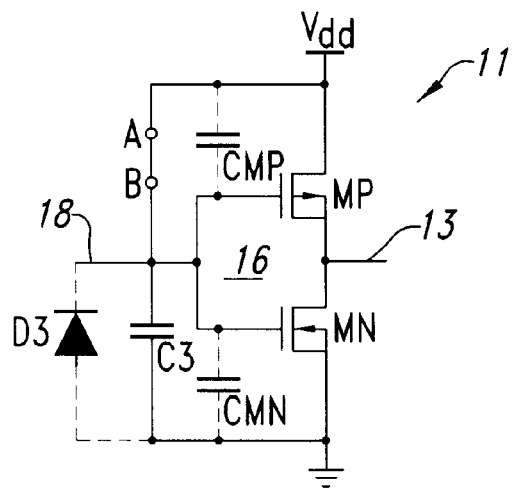
FIG. 3 is a circuit diagram of the device of FIG. 1.

In the practical embodiment of the device according to the invention, shown in FIG. 3, the inverter 16 comprises a pair of complementary field-effect transistors, that is, a p-channel transistor, indicated MP, and an n-channel transistor, indicated MN, having common drain electrodes, forming the output terminal 13, common gate electrodes, forming the input terminal 18, and source electrodes, of which one is connected to the positive supply terminal Vdd and the other to the negative supply or ground.

The diagram also shows the intrinsic capacitances CMP, CMN, existing between the gate and source terminals of the transistors MP and MN, respectively, as well as a capacitor C3 and a diode D3 which correspond, respectively, to the capacitor C1 and to the diode D1 of FIG. 1. In selecting the capacitance of the capacitor C3, account must be taken of the intrinsic capacitances indicated above. It should be noted, in this connection, that the capacitance CMN increases the effect of the capacitor C3 between the input terminal 18 and ground, whereas the capacitance CMP tends to reduce that effect. If CMN, CMP and C3 indicate the capacitances of the capacitors indicated by the same symbols in the drawing and Vs indicates the threshold of the inverter, that is, the voltage between the input terminal 18 and ground which causes the logic state at the output terminal 13 to change, the capacitance of the capacitor C3 must satisfy the following relationship:

$$CMP/(C3+CMN+CMP)\cdot Vdd < Vs$$

The transistors MP and MN can be of a size such that the threshold is sufficiently high and the transistor MP can be very small and hence with a low capacitance CMP, so that the capacitor C3 can be very small.

Figure 4:
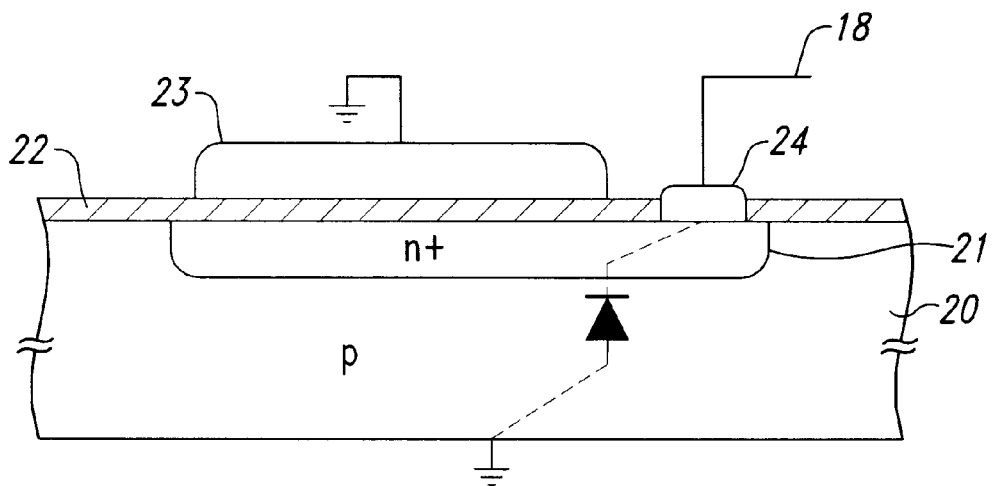
FIG. 4 shows a cross-section of a portion of the integrated circuit having the device according to the invention of FIG. 1.

The device described above can be produced particularly advantageously by a method of manufacturing CMOS silicon integrated circuits in which the capacitors can be formed with the use, as electrodes, of a strongly doped region of the silicon substrate, for example, a region implanted with arsenic on a p-type substrate, and of an opposed portion of polycrystalline silicon, separated by a thin layer of silicon dioxide. In this case, the capacitor C3 is formed as shown in FIG. 4, in which the silicon substrate is indicated 20, the strongly doped n-type region which forms the first electrode is indicated 21, the silicon dioxide which forms the dielectric is indicated 22, and the layer of polycrystalline silicon which forms the second electrode is indicated 23. A metal connection 24 formed on the surface of the region 21 leads to the gate electrodes of the two transistors (not shown), that is, to the input terminal 18 of the inverter 16, and the second electrode 23 is connected to the ground terminal, as is also the substrate 20, however, as often required for CMOS integrated circuits on p-type substrates.

It should be noted that the diode D3 of FIG. 3 is formed together with the capacitor C3, without the use of additional silicon area and without further process steps. As can easily be seen, the diode is in fact formed by the junction between the region 21 and the substrate 20. Similarly, with a different process, it would be possible to produce a diode the cathode of which had a certain capacitance with respect to ground, so that it would not be necessary to form an actual capacitor, since the parasitic or inherent capacitance of the diode could be used to perform the function of the capacitor C3.

As can easily be confirmed, the device according to the invention can be formed in a very small area, since it is formed solely by two signal transistors, that is, very low-power transistors, by a capacitor of small capacitance, and by a diode which, as in the embodiment described above, results intrinsically from the structure of the capacitor and, moreover, requires no control signal and therefore no additional conductive track on the integrated circuit. Furthermore, it has practically zero consumption since the currents involved are only leakage currents. In a practical embodiment on an integrated circuit with an area of 25 mm$^2$, the device according to the invention occupied an area of about 500 $\mu$m$^2$.

By way of indication, with one of the known techniques cited at the beginning, except for that which provides for different metallization masks for the different options, an area at least 10 times greater would be taken up in order to obtain similar design options.

Naturally, many of these devices may be formed at the same time on the same integrated circuit so as to enable all the possible design options to be evaluated. Once all the most favorable design variants have been identified, a single mask can be provided to define the connection layout of the integrated circuit intended for production. Any future variations will be possible by the modification solely of this mask.

Although only one embodiment of the invention has been described and illustrated, clearly many variants are possible within the spirit and scope of the same innovative concept. For example, the inverter may be replaced by non-complementary field-effect transistors, or by complementary or non-complementary bipolar transistors, or by a non-inverting buffer, according to the type of integrated circuit for which the device according to the invention is intended, and according to the manufacturing process available at the time in question.

What is claimed is:

1. A device for selecting between design options in an integrated circuit, comprising
    first and second supply terminals which can be connected to a voltage supply;
    a circuit unit which can adopt two different operative states in dependence on a signal applied to a control terminal thereof;
    an inverter having an output terminal connected to the control terminal of the circuit unit and an input terminal connected both to the first supply terminal, by means of a conductor which can be broken by means outside the integrated circuit, and to the second supply terminal, by a capacitive element connected in parallel with a component with unidirectional conduction, connected for reverse conduction.

2. A device according to claim 1, in which the inverter comprises a pair of complementary field-effect transistors with common drain electrodes forming the output terminal of the inverter, with common gate electrodes forming the input terminal of the inverter, and with source electrodes of which one is connected to the first supply terminal and the other is connected to the second supply terminal.

3. The circuit of claim 1 wherein said inverter comprises:
    first and second complementary field-effect transistors each having a drain terminal coupled to said buffer output terminal, a gate terminal coupled to said buffer input terminal, and a source terminal coupled to a respective one of said supply terminals.

4. A device for selecting between design options in an integrated circuit comprising:
    first and second supply terminals which can be connected to a voltage supply;
    a substrate of semiconductor material of a first conductivity type having the integrated circuit formed thereon;
    at least one circuit unit which can adopt two different operative states in dependence on a control terminal input;
    a buffer having an input node and an output terminal, said output terminal being coupled to the control terminal input;
    a conductor element coupled between the first supply terminal and the input node, the conductor element having means which can be broken by means outside the integrated circuit, for being permanently broken within the integrated circuit;
    a capacitive element coupled between the second supply terminal and the input node and having a charge value less than a threshold voltage value of said buffer,
    the capacitive element having a first electrode constituted by a region of a second conductivity type formed on a surface of the substrate and forming a junction therewith, a layer of dielectric material which covers the surface of the substrate on this region, and a second electrode constituted by a layer of electrically conductive material which extends on the dielectric layer, above the region; and
    a unidirectional conduction element connected directly in parallel with the capacitive element, the unidirectional conduction element having one terminal connected to the input node of the buffer and to the first electrode of the capacitive element and another terminal connected to the substrate and to the second electrode of the capacitor.

5. The circuit of claim 4 wherein said buffer comprises an inverter.

6. The circuit of claim 4 wherein said integrated device and said buffer comprise components formed in said substrate.

7. The device according to claim 1 in which the first supply terminal is connected to a positive voltage supply and the second supply terminal is connected to ground.

8. The device according to claim 1 in which the first supply terminal is connected to ground and the second supply terminal is connected to a positive voltage supply.

9. The device according to claim 1 wherein a first plate of the capacitive element is formed in a semiconductor substrate of the integrated circuit and a second plate of the capacitive element is formed in a conductive layer positioned overlaying the first plate of the capacitive element in the semiconductor substrate and an insulating layer is positioned therebetween; and
    a grounded conductor is in electrical contact with the first plate of the capacitive element in the semiconductor substrate.

10. A circuit for selecting one of a number of design configurations for an integrated device, comprising:
    first and second supply terminals, said second supply terminal operable to be coupled to ground;
    a unit operable to be configured in one of said configurations in response to a signal;
    a removable link having a first link terminal coupled to said first supply terminal, and a second link terminal;

a buffer having a buffer input terminal coupled to said second link terminal and a buffer output terminal coupled to said unit, said buffer operable to generate said signal at said output terminal;

a diode having a cathode coupled to said buffer input terminal and an anode coupled to said second supply terminal; and a capacitor coupled in parallel to said diode.

11. The circuit of claim 10 wherein:

the capacitor includes a substrate having a first conductivity type acting as a first place of the capacitor;

a dielectric layer overlaying the substrate; and a conductive layer on the dielectric layer, overlaying the substrate acting as the second place of the capacitor.

* * * * *

UNITED STATES PATENT AND TRADEMARK OFFICE
CERTIFICATE OF CORRECTION

PATENT NO. : 6,100,747
DATED : August 8, 2000
INVENTOR(S) : Pierangelo Confalonieri It is certified that error appears in the above-identified patent and that said Letters Patent is hereby corrected as shown below:

<u>Title page,</u>
Item [30], the foreign application priority data should read
-- May 30, 1994  [EP]  European Pat. Off.   ...................94830261.7 --.

Signed and Sealed this

Thirteenth Day of November, 2001

Attest:

NICHOLAS P. GODICI
Attesting Officer   Acting Director of the United States Patent and Trademark Office